United States Patent

Takamizawa et al.

[11] Patent Number: 5,998,283
[45] Date of Patent: Dec. 7, 1999

[54] SILICON WAFER HAVING PLASMA CVD GETTERING LAYER WITH COMPONENTS/COMPOSITION CHANGING IN DEPTHWISE DIRECTION AND METHOD OF MANUFACTURING THE SILICON WAFER

[75] Inventors: Shoichi Takamizawa, Nishishirakawa; Norihiro Kobayashi, Annaka, both of Japan

[73] Assignee: Shin-Etsu Handotai Co., Ltd., Tokyo, Japan

[21] Appl. No.: 08/907,884

[22] Filed: Aug. 11, 1997

[30] Foreign Application Priority Data

Aug. 19, 1996  [JP]  Japan ................................. 8-235870

[51] Int. Cl.⁶ ......................... H01L 21/322; H01L 21/44
[52] U.S. Cl. ......................... 438/476; 438/680; 438/471; 438/778; 438/788; 438/DIG. 928; 257/DIG. 913; 148/DIG. 24; 148/DIG. 60
[58] Field of Search ..................... 438/680, 473, 438/476, 471, 928, 778, 788; 257/DIG. 913; 148/DIG. 24, DIG. 60, DIG. 61

[56] References Cited

U.S. PATENT DOCUMENTS

| | | |
|---|---|---|
| 3,663,319 | 5/1972 | Rose ......................................... 148/175 |
| 3,769,104 | 10/1973 | Ono et al. ................................ 148/175 |
| 4,608,096 | 8/1986 | Hill . |
| 4,662,956 | 5/1987 | Roth et al. ............................... 148/175 |
| 4,925,809 | 5/1990 | Yoshiharu et al. . |
| 5,296,385 | 3/1994 | Moslehi et al. ............................ 437/20 |
| 5,374,842 | 12/1994 | Kusakabe ................................. 257/487 |
| 5,461,002 | 10/1995 | Safir ........................................ 437/160 |
| 5,665,175 | 9/1997 | Safir ........................................ 136/255 |
| 5,721,145 | 2/1998 | Kusakabe et al. ......................... 437/12 |
| 5,751,055 | 5/1998 | Maruyama et al. ..................... 257/618 |
| 5,798,294 | 8/1998 | Okonogi .................................. 438/476 |

FOREIGN PATENT DOCUMENTS

| | | |
|---|---|---|
| 0 120 830 A2 | 10/1984 | European Pat. Off. . |
| 37 17 440 A1 | 12/1988 | Germany . |
| 59-186331 | 10/1984 | Japan . |
| 4-2133 | 1/1992 | Japan . |

Primary Examiner—Charles Bowers
Assistant Examiner—Sam Lee
Attorney, Agent, or Firm—Oliff & Berridge, PLC

[57] ABSTRACT

In a silicon wafer having a CVD film formed on one main face and having the other main face mirror-polished, the components and/or composition of the CVD film change in the thicknesswise direction of the film. This makes it possible to provide a silicon wafer having a thin film provided on the back surface, which thin film has excellent and persistent gettering capability that can remove a greater variety of types of elements and can prevent autodoping.

20 Claims, 2 Drawing Sheets

SILICON WAFER HAVING PLASMA CVD GETTERING LAYER WITH COMPONENTS/ COMPOSITION CHANGING IN DEPTH-WISE DIRECTION AND METHOD OF MANUFACTURING THE SILICON WAFER

BACKGROUND OF THE INVENTION

1. Field of the Invention

The present invention relates to a silicon wafer and a method of manufacturing the silicon wafer, and more particularly a silicon wafer which has a film formed by chemical vapor deposition (a CVD film), particularly a film formed by plasma chemical vapor deposition (a plasma CVD film), serving as both a gettering layer and a protective film for preventing autodoping. Further, the present invention relates to a silicon epitaxial wafer produced from the silicon wafer.

2. Description of the Related Art

Of the two main faces of a silicon wafer other than its edge, a device is fabricated on one main face (hereinafter referred to as a "front surface") of the silicon wafer. The technique of forming a thin film on the other main face (hereinafter referred to as a "back surface") of the silicon wafer has two principal objects.

One object is to utilize the thin film as a layer for gettering impurities such as heavy metals, and the other object is to utilize the thin film as a protective film for preventing autodoping that would otherwise occur when a layer is epitaxially grown on the silicon wafer.

Gettering is the technique of collecting impurities, such as heavy metals, produced during the course of manufacture of a silicon electronic device on the silicon wafer outside the regions in the vicinity of the front surface of the silicon wafer where devices are fabricated. By virtue of this technique, there can be prevented the degradation of the characteristics of the devices by impurities such as heavy metals, which in turn allows an increase in the ratio of non-defective silicon devices to the entire silicon devices to be manufactured.

As disclosed in, e.g., Japanese Patent Application Laid-open No. 59–186331, one representative gettering technique is the technique of forming a gettering layer by depositing polycrystalline silicon on the back surface of the silicon wafer through use of low-pressure chemical vapor deposition (the low-pressure CVD method). In order to improve the gettering capability, there has been proposed a method of depositing amorphous silicon in place of the polycrystalline silicon (see Japanese Patent Application Laid-open No. 4–2133).

Autodoping is a phenomenon in which a dopant evaporates principally from the back surface of the silicon wafer into the gas phase to be used for epitaxial growth when a silicon epitaxial wafer is manufactured, and the thus-evaporated dopant is incorporated into the epitaxial layer.

In a case where the resistivity of the silicon wafer to be subjected to epitaxial growth is low, or where there is a high concentration of dopants, autodoping occurs to a noticeable extent. If the epitaxial layer containing dopants in small concentration is grown, a transition width (i.e., the width of an area where the concentration of dopants changes in the vicinity of the interface between an epitaxial layer and the silicon wafer) is extended, which makes it difficult to control the resistivity of the epitaxial layer. If a silicon device is fabricated through use of a silicon wafer having an epitaxial layer with a wide transition area, the device fails to exhibit its originally-designed characteristics, thereby rendering the device defective.

For this reason, in a commonly-used technique, a protective film for the purpose of preventing autodoping is formed on the back surface of a silicon wafer in order to prevent the autodoping in a case where the silicon wafer having a high concentration of dopants is subjected to epitaxial growth. An atmospheric-pressure silicon oxide film (an atmospheric-pressure CVD oxide film) grown in an atmospheric-pressure chemical vapor deposition apparatus (an atmospheric-pressure CVD system) is primarily used as the protective film.

As the integration and performance of the silicon devices have been improving in recent years, there has arisen a demand for improvements in persistency of gettering capability of the silicon wafer to be used as a material of the silicon electronic devices, in addition to a demand for improvements in the gettering capability.

However, if the gettering layer is formed by depositing the polycrystalline silicon or amorphous silicon, there are only a limited number of elements which can be expected to be removed by gettering. For this reason, there is a limit to the gettering capability of the gettering layer. As the silicon wafer receives heat during the fabrication of the device, transformation of the polycrystalline silicon or amorphous silicon into monocrystalline silicon proceeds, thereby resulting in deterioration of the gettering capability. Thus, there is a problem with the persistency of the gettering capability of the silicon wafer.

In a case where a silicon monocrystal is epitaxially grown on the front surface of the silicon wafer having a gettering layer of polycrystalline or amorphous silicon on the back surface, dopants easily penetrate through the polycrystalline or amorphous silicon. Particularly, in a case where the silicon wafer to be subjected to epitaxial growth contains a high concentration of dopants, polycrystalline or amorphous silicon is deposited on the back surface of the silicon wafer, and an atmospheric-pressure CVD oxide film is further deposited on the polycrystalline or amorphous silicon, thereby preventing autodoping. These deposition operations are carried out in individual steps, so that the production cost increases.

SUMMARY OF THE INVENTION

In view of the foregoing descriptions, an object of the present invention is to provide a silicon wafer having a thin film provided on the back surface, which thin film has an excellent and persistent gettering capability that can remove a greater variety of types of elements, and can prevent autodoping.

The present inventors have discovered that this object can be accomplished by formation of a CVD film whose components and/or composition change in the thicknesswise direction of the film through use of the chemical vapor deposition (CVD) method. In other words, by the CVD method, the CVD film whose components and/or composition change in the thicknesswise direction of the film can be formed through one process step or in a consecutive manner. Consequently, a CVD film consisting of many types of layers of differing components, or a CVD film whose composition continuously changes in the thicknesswise direction of the film can be inexpensively formed. Such a CVD film whose components and/or composition change in the thicknesswise direction of the film can remove a greater variety of types of elements in comparison with the conventional CVD film, and has improved persistent gettering capability. Further, the CVD film can prevent autodoping. Moreover, it has been acknowledged that the CVD film whose components and/or composition change in the thicknesswise direction of the film possesses high gettering capability even if the thickness of the film is comparatively small.

In accordance with one aspect of the present invention, there is provided a silicon wafer having a CVD film formed on one main face (the back surface) and having the other main face mirror-polished (the front surface), wherein the components and/or composition of the CVD film change in the thicknesswise direction of the film.

Preferably, the components and/or composition of the CVD film change within any one of the ranges 0 ≦suffix x 2 for $SiO_x$, 0 ; ≦suffix z <1.34 for $SiN_z$, or 0 ≦suffix x ≦2, 0 ≦suffix y <1.34 for $SiO_xN_y$. If the components and/or composition of the CVD film change within this range, the gettering capability and the autodoping prevention capability of the silicon wafer become superior. Further, with these conditions, it is easy to obtain materials to be used for formation of such a CVD film.

In the silicon wafer of the present invention, preferably, the components and/or composition of the CVD film changes in the thicknesswise direction of the film within the range of 0 ≦suffix x ≦2 for $SiO_x$. Such a CVD film is realized by comprising: e.g., i) an amorphous silicon layer (where suffix "x" of $SiO_x$ is 0), and a $SiO_x$ layer (where 0 <suffix x ≦2, for example, x =2), wherein the amorphous silicon layer and the $SiO_x$ layer are alternatively stacked such that the total number of layers becomes two, preferably three or more (in this case, the components of the CVD film change);

ii) a $SiO_x$ layer, where x changes within the range of 0 <suffix x ≦2 in the thicknesswise direction of the film (in this case, the composition of the CVD film changes); or iii) an amorphous silicon layer and an $SiO_x$ layer whose suffix x changes within the range of 0 <suffix x ≦2 in the thicknesswise direction of the film, wherein the amorphous silicon layer and the $SiO_x$ layer are alternatively stacked such that the total number of layers becomes two, preferably three or more (see FIG. 2 which shows a case where the components and composition of the CVD film change).

Preferably, in the silicon wafer of the present invention, the components and/or composition of the CVD-film change in the thicknesswise direction of the film within the range of 0 ≦suffix z <1.34 for $SiN_z$. This CVD film is realized by comprising: e.g., an amorphous silicon layer (in a case where suffix z of $SiN_z$ is 0) and an $SiN_z$, layer (O <suffix z <1.34; e.g., z =1.333), wherein the amorphous silicon layer and the SiNz layer are alternately stacked such that the total number of layers becomes two, preferably three or more (in the case, the components of the CVD film change).

Preferably, in the silicon wafer of the present invention, the components and/or composition of the CVD film change in the thicknesswise direction of the film within the range of 0 ≦suffix x ≦2 and 0 <suffix y <1.34 for $SiO_xN_y$. This CVD film is realized by comprising: e.g., iv) an amorphous silicon layer (in a case where both suffixes x and y of $SiO_xN_y$ are 0) and an $SiO_xN_y$ layer (0<suffix x≦2, 0<suffix y<1.34 ), wherein the amorphous silicon layer and the $SiO_xN_y$ layer are alternatively stacked such that the total number of layers becomes two, preferably three or more; or an amorphous silicon layer, a $SiN_y$ layer whose suffix y changes in the thicknesswise direction of the film within the range of 0<suffix y<1.34, and one $SiO_x$ layer (0<suffix x≦2, e.g., x=2), wherein the amorphous silicon layer and the $SiN_y$ layer are alternately stacked such that the total number of layers becomes two, preferably three or more, with the $SiO_x$ layer outermost (see FIG. 3 showing a case where the components and composition of the CVD film change).

Of the previously-described CVD films, the CVD film comprising the amorphous silicon layer and the $SiO_x$ layer whose composition changes [corresponding to iii)] and the CVD film comprising the amorphous silicon layer, the $SiN_y$ layer whose composition changes, and one $SiO_x$ layer [corresponding to v]] particularly preferable. These CVD films are capable of removing a greater variety of types of elements by gettering and possess particularly superior gettering capability. Further, in these CVD films, it takes considerably long for the amorphous silicon layer to become monocrystalline, and therefore the CVD films are particularly superior in terms of persistency of the gettering capability.

In a case where the majority of the CVD film is comprised of amorphous silicon and the CVD film contains O or N in small proportions, a layer which contains O or N in as high proportions as possible should preferably be provided as the outermost stacked layer of the CVD film in order to ensure prevention of the autodoping effect.

In the present invention, a plasma CVD film formed by plasma CVD is particularly preferable. The reason for this is that the plasma CVD permits comparatively easy manufacture of a plasma CVD film only in one process step.

In accordance with another aspect of the present invention, there is provided a method of manufacturing the foregoing silicon wafer, wherein a CVD film is formed on one main face of the silicon wafer in one process step or in a consecutive manner by CVD in such a way that the components and/or composition of the CVD film change in the thicknesswise direction of the film.

By the CVD method, the CVD film whose components and/or composition change in the thicknesswise direction of the film can be formed in a single process step or in a consecutive manner. As a result of the formation of the CVD film in such a way that the components and/or composition of the film change in the thicknesswise direction, there is obtained a silicon wafer which has an excellent and persistent superior gettering capability and prevents the autodoping effect.

A common silicon-wafer manufacturing method comprises the steps of: slicing a silicon monocrystal rod into silicon wafers; and chamfering, lapping, chemical etching, and mirror-polishing the thus-obtained wafers. In contrast, in the present invention, the CVD film is formed after the wafer has been subjected to chemical etching or after one side or both sides of the wafer have been mirror-polished. In a case where the main face of the wafer is already mirror-polished, the CVD film is formed on the back surface of the wafer so as to be prevented from going around to the main face. As a result, a step to thereafter mirror-polish the main face can be omitted.

In the present invention, the CVD film can be formed in one process step or in a consecutive manner such that the components and/or composition of the film change in its thicknesswise direction by changing conditions for growing the CVD film, such as a deposition temperature, a deposition pressure, the type of reaction gas, and the flow rate of the gas, in accordance with the application of the silicon wafer.

Preferably, the silicon wafer is a silicon epitaxial wafer in which a silicon monocrystalline thin-film is epitaxially grown on the mirror-polished main face of the silicon wafer. In this silicon epitaxial wafer, a transition area is narrow, and the resistivity of the epitaxial layer is controlled superiorly. A silicon device fabricated through use of such a silicon epitaxial wafer exhibits the characteristics as designed.

As has been described, the present invention makes it possible to inexpensively provide a silicon wafer having an excellent and persistent gettering layer which has gettering capability with respect to a greater variety of types of elements and autodoping-prevention capability. Further, an epitaxial wafer having a narrow transition width can be provided as a result of use of such a silicon wafer.

DESCRIPTION OF THE INVENTION AND EMBODIMENTS THEREOF

In reference to the accompanying drawings, the present invention will be described hereinbelow.

First, an explanation will be given with reference to FIGS. 1A through 1D.

Figure 1A:
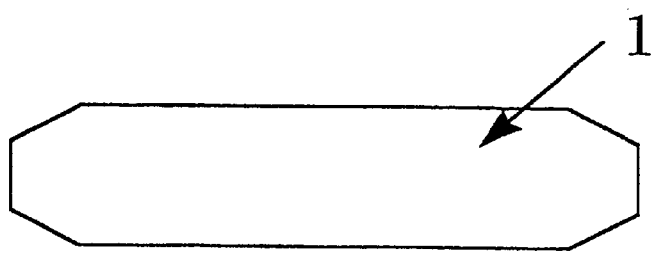
FIGS. 1A to 1D are schematic representations showing one exemplary process for manufacturing a silicon wafer and a silicon epitaxial wafer in accordance with the present invention.

A silicon wafer 1 is first prepared by a known manufacturing method (FIG. 1A). Here, although a chemically-etched wafer before it is mirror-polished is commonly used as this silicon wafer 1, a mirror-polished wafer which is mirror-polished at one or both sides may be also employed.

Figure 1B:
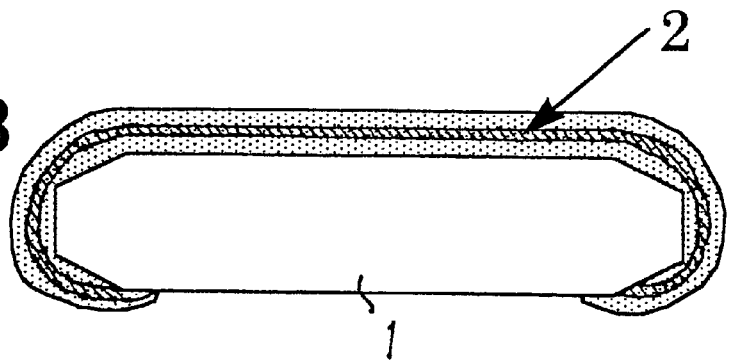

Subsequently, a CVD film 2 is deposited on the back surface of the silicon wafer through use of a CVD apparatus (FIG. 1B). The components and composition of a CVD film to be deposited are changed in the thicknesswise direction of the film. In this event, there are preferably combined more than one layer of an amorphous silicon layer (Si), a silicon oxide layer ($SiO_x$: 0<suffix $x \leq 2$), a silicon nitride layer ($SiN_z$: 0<suffix $z<1.34$), and a silicon oxynitride layer ($SiO_xN_y$: 0<suffix $x \leq 2$, and 0 <suffix $y<1.34$). More preferably, component x, y, or z in one film is changed in the thicknesswise direction of the CVD film. Such a CVD film is provided with superior gettering and autodoping-prevention capability, and source gases of such a CVD film are easy to obtain.

The components and composition of the CVD film can be changed in the thicknesswise direction of a CVD film to be deposited by programming the CVD apparatus with regard to the deposition temperature, the deposition pressure, the deposition time, the type of reactive gas, or the flow rate in accordance with the application of the silicon wafer. Accordingly, the CVD film whose components and composition change in the thicknesswise direction thereof can be deposited on a silicon wafer in one process step or in a consecutive manner. In this event, the thickness of a CVD film to be deposited is preferably within the range of 50 to 500 nm. Further, the deposition temperature and pressure are preferably within the range of 100 to 450° C. and 0.1 to 10 torr, respectively.

Figure 1C:
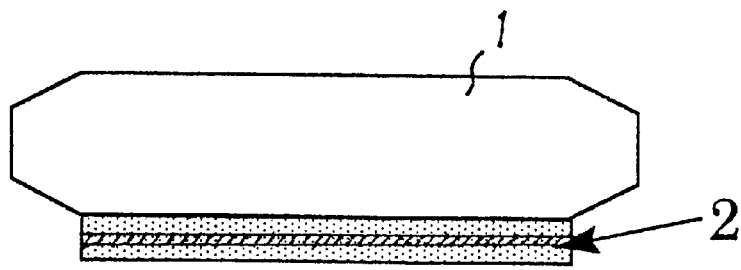

As described above, after the CVD film 2 has been deposited on the silicon wafer 1, the front surface and the edge of the silicon wafer are mirror-polished (FIG. 1C). At this time, the CVD film deposited on the front surface of the silicon wafer to be mirror-polished can be finished at a very high speed, whereby the CVD film can be easily removed without impairing the flatness of the silicon wafer by polishing.

In a case where a mirror-polished wafer whose one or both sides are mirror-polished is used as the silicon wafer on which a CVD film is deposited, and where the front surface of the silicon wafer opposite to the surface on which a CVD film is deposited is mirror-polished, a CVD film is deposited on the back surface of the silicon wafer so as not to pass around to the mirror-polished surface, whereby a step to mirror polish the front surface after the deposition of the CVD film can be omitted.

Throughout the foregoing procedures, there is obtained a silicon wafer with a gettering layer which has superiorly-persistent gettering capability with respect to a greater variety of types of elements in comparison with the conventional silicon wafer and an autodoping-prevention effect. Further, since the CVD film is formed in one process step, it can be manufactured more inexpensively.

Figure 1D:
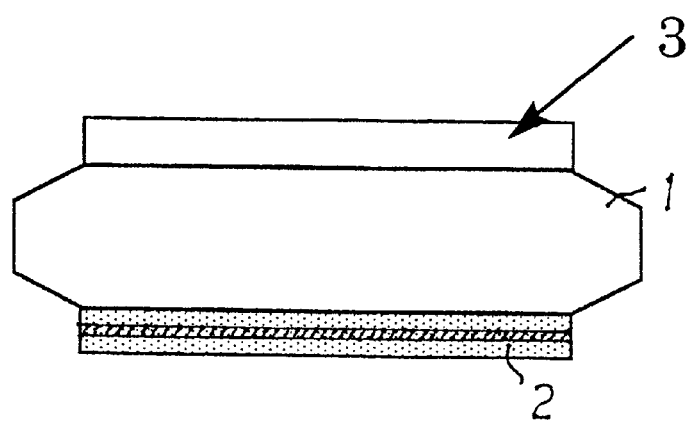

Even when a silicon monocrystalline thin-film is epitaxially grown on the front surface of the thus-formed silicon wafer through use of a commercially available epitaxial growth apparatus, the prevention of an autodoping phenomenon; i.e., the prevention of incorporation of dopants released from the silicon wafer, facilitates the control of the resistivity of the epitaxial layer even in a case where the silicon wafer contains a high concentration of dopants. There is obtained a silicon epitaxial wafer having an epitaxial layer 3 whose resistivity is the same as originally designed (FIG. 1D).

EXAMPLES

Studies were carried out on the gettering capability of the silicon wafer in accordance with the present invention on the persistency of the gettering capability, and on the autodoping-prevention capability of the same at the time of epitaxial growth.

A silicon monocrystalline rod produced by the Czochralski method [the silicon monocrystal has a (100) main face, a p-type conductivity, and a resistivity of 0.01 Ω·cm] was sliced to obtain four wafers (CZ wafers), which were then subjected to chamfering, lapping, and chemical etching processes.

Further, a silicon monocrystalline rod produced by the floating zone method [the silicon monocrystal has a (100) main face, an n-type conductivity, and a resistivity of 20 Ω·cm] was sliced to obtain eight wafers (FZ wafers), which were then subjected to chamfering, lapping, and chemical etching processes.

As shown in Table 1, plasma CVD films (Examples 1 and 2 of the present invention) or a polycrystalline silicon film (Comparative example 1) were formed on one main face of the foregoing wafers, or none of the films were formed on the wafer (Comparative example 2).

TABLE 1

| Kinds of wafers Evaluated items | FZ wafer | | CZ wafer |
|---|---|---|---|
| | Gettering capability | Persistency of gettering capability | Autodoping prevention capability |
| Example 1 | 1 | 1 | 1 |
| Example 2 | 1 | 1 | 1 |
| Comparative example 1 | 1 | 1 | 1 |
| Comparative example 2 | 1 | 1 | 1 |

1) Example 1

A plasma CVD film which was comprised of a component Si and O and was grown through use of a plasma CVD apparatus:

Growth Conditions:

Growth temperature: 425°C.,

Deposition thickness: 0.5μm,

Pressure in a furnace: 3 torr,

Reaction gas: monosilane, dinitrogen oxide,

Carrier gas: nitrogen

Figure 2:
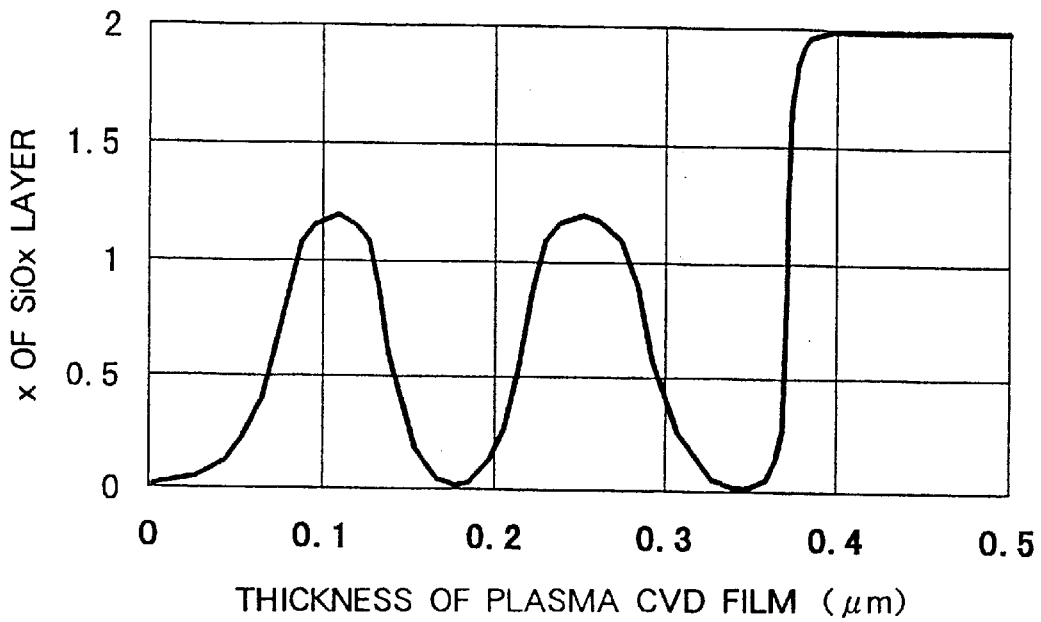
FIG. 2 is a plot showing thicknesswise variations in the composition and components of a plasma CVD film formed on the back surface of a silicon wafer in Example 1.

Thicknesswise profile of components-and-composition of the film: shown in FIG. 2

2) Example 2

A plasma CVD film which was comprised of components Si, O, N and was grown through use of the plasma CVD apparatus:

Growth Conditions:

Growth temperature: 425°C.,

Deposition thickness: 0.5μm,

Pressure in a furnace: 3 torr,

Reaction gas: monosilane, dinitrogen oxide, ammonia

Carrier gas: nitrogen

Figure 3:
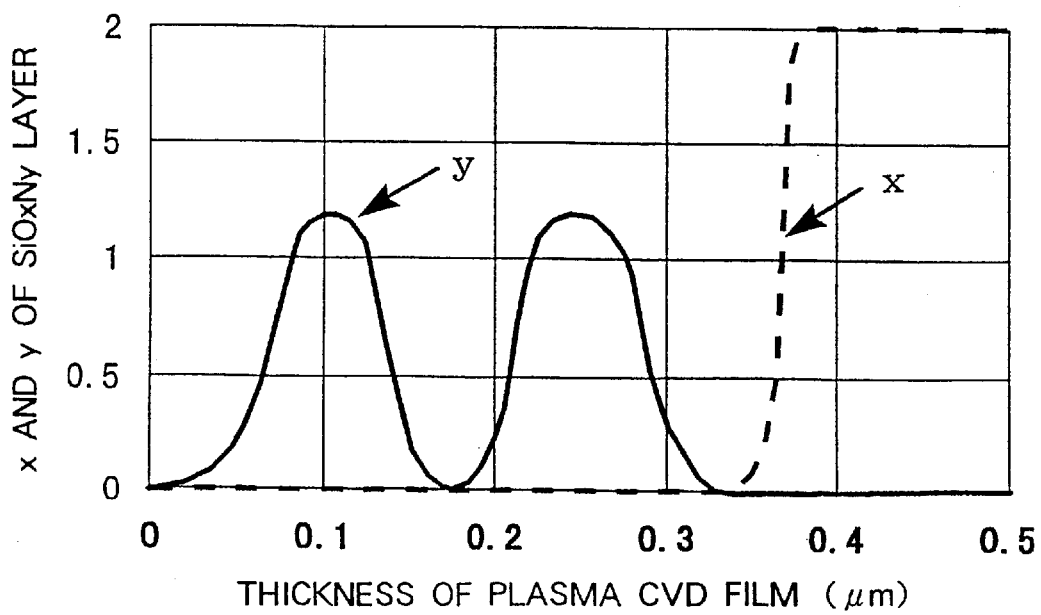
FIG. 3 is a plot showing thicknesswise variations in the composition and components of a plasma CVD film formed on the back surface of a silicon wafer in Example 2.

Thicknesswise profile of components-and-composition of the film: shown in FIG. 3

3) Comparative Example 1

A polycrystalline silicon film grown through use of a low-pressure CVD apparatus:

Growth Conditions:

Growth temperature: 650°C.,

Deposition thickness: 1.5μm,

Pressure in a furnace: 0.1 torr,

Reaction gas: monosilane,

Carrier gas: hydrogen

Subsequently, the other main face of the wafer having a plasma CVD film or polycrystalline silicon firm formed on one main face thereof was polished. Further, one of the two main faces of the wafer on which no film was formed was also polished. As a result, there were manufactured three wafers for each of the four types of silicon wafers; namely, the mirror-polished silicon wafers having three types of gettering layers (Examples 1 and 2 and Comparative example 1) and the mirror-polished silicon wafer without the gettering layer for the purpose of reference (Comparative example 2).

These silicon wafers were examined in the following manner with regard to the gettering capability, the persistency of the gettering capability, and the autodoping-prevention capability at the time of epitaxial growth.

1). Gettering Capability

A solution containing a plurality of heavy metal ions (iron, copper, chrome, and nickel ions) was applied to each front surface of the four types of wafers, so that the wafers were intentionally contaminated. Subsequently, they underwent heat treatment at 1000° C. for 1 hr, whereby the heavy metal ions were diffused into the wafer. Subsequently, after they had been subjected to heat treatment at 650° C. for 10 hrs., the concentration of heavy metals in each silicon wafer with the exception of its gettering layer was measured through use of the DLTS method (Deep Level Transient Spectroscopy) and the ICP-MS method (Inductively-coupled Plasma Mass Spectrometer). While the concentration of each heavy metal contained in the wafer without the gettering layer was used as a standard, the proportion of each heavy metal captured in each gettering layer was calculated from the resultant measurement of the concentration of each heavy metal.

Table 2 shows the results of such calculation.

TABLE 2

| | Capability of gettering various heavy metals | | | |
|---|---|---|---|---|
| | Iron | Copper | Chromium | Nickel |
| Example 1 | 99% | 89% | 85% | 75% |
| Example 2 | 99% | 87% | 85% | 77% |
| Comparative example 1 | 93% | 72% | 35% | 25% |
| Comparative example 2 | 0% | 0% | 0% | 0% |

Table 2 shows that the plasma CVD film in accordance with the present invention exhibits a sufficient gettering effect with respect to chromium and nickel in comparison with the polycrystalline silicon film of the comparative example 1 which exhibits an insufficient gettering effect. Accordingly, it is acknowledged that the plasma CVD film in accordance with the present invention possesses superior gettering capability than that of the polycrystalline silicon film.

2) Persistency of Gettering Capability

After the four types of wafers had been subjected to heat treatment at 1050° C. for 1 hr., a solution containing iron ions was applied to the front surface of each of the wafers, so that they were intentionally contaminated, after that, the wafers underwent heat treatment at 1000 ° C. for 1 hr, whereby iron was diffused into the wafers. Subsequently, after the wafers had been subjected to heat treatment at 650° C. for 10 hrs., the concentration of iron in each wafer with the exception of its gettering layer was measured. While the concentration of iron of the wafer without the gettering layer was used as a reference, the proportion of iron captured by the gettering layer was calculated from the resultant measurement of the concentration of iron.

Table 3 shows the results of such calculation.

TABLE 3

|  | Gettering capability |
| --- | --- |
| Example 1 | 90% |
| Example 2 | 90% |
| Comparative example 1 | 70% |
| Comparative example 2 | 0% |

Table 3 shows that the plasma CVD film in accordance with the present invention retains superior gettering capability after having undergone heat treatment in comparison with the polycrystalline silicon film of Comparative example 1; namely, the plasma CVD film is superior in the persistency of gettering capability.

3) Autodoping-prevention Capability at the time of Epitaxial Growth

An epitaxial layer was grown on each of the four types of wafers under the following conditions through use of an epitaxial growth apparatus.

Growth temperature: 1100° C.

Epitaxial layer: 10 $\mu$m thick,

Resistivity: 10 $\Omega \cdot$cm,

Conductivity type: P-type

In the growth of an epitaxial layer, the four types of wafers were subjected to batch processing one by one so as to prevent the wafers from being affected by autodoping.

A chip measuring 3 mm was cut out of the center of each of the four types of wafers on which the epitaxial layers were formed. The surface of the epitaxial layer of each chip was obliquely polished (bevel or angle polishing), and the profile of spreading resistance in the interface between the epitaxial layer and the silicon wafer in the depthwise direction was measured through use of a spreading-resistance measurement instrument, whereby a transition width is obtained. Table 4 shows the results of such measurement.

TABLE 4

|  | Example 1 | Example 2 | Comparative example 1 | Comparative example 2 |
| --- | --- | --- | --- | --- |
| Transition width | 1.4 $\mu$m | 1.4 $\mu$m | 1.6 $\mu$m | 2.5 $\mu$m |

Table 4 shows that the silicon wafer having the plasma CVD film in accordance with the present invention has a narrower transition width than that of the silicon wafer having the polycrystalline silicon film. It is acknowledged that the plasma CVD film in accordance with the present invention has superior autodoping-prevention capability at the time of epitaxial growth as well as superior gettering capability.

The present invention is not limited to the above-described embodiments. The above-described embodiments are mere examples, and those having the substantially same structure as that described in the appended claims and providing the similar action and effects are included in the scope of the present invention.

What is claimed is:

1. A silicon wafer having a CVD film formed on one main face and having the other main face mirror-polished, wherein the composition of at least a partial portion of the CVD film continuously changes in the thicknesswise direction of the CVD film.

2. A silicon wafer according to claim 1, wherein the CVD film comprises $SiO_x$, and the suffix x continuously varies in the range of $0 \leq x \leq 2$.

3. A silicon wafer according to claim 1, wherein the CVD film comprises $SiN_z$ and the suffix z continuously varies in the range of $0 \leq z < 1.34$.

4. A silicon wafer according to claim 1, wherein the CVD film comprises $SiO_xN_y$, and the suffix x countinuously varies in the range of $0 \leq x \leq 2$, while the suffix y varies in the range of $0 \leq y < 1.34$.

5. A silicon wafer according claim 1, wherein the CVD film is formed by plasma chemical vapor deposition.

6. A silicon wafer according claim 2, wherein the CVD film is formed by plasma chemical vapor deposition.

7. A silicon wafer according claim 3, wherein the CVD film is formed by plasma chemical vapor deposition.

8. A silicon wafer according claim 4, wherein the CVD film is formed by plasma chemical vapor deposition.

9. A silicon epitaxial wafer in which a silicon monocrystalline thin-film is epitaxially grown on the mirror-polished main face of the silicon wafer according to claim 1.

10. A silicon epitaxial wafer in which a silicon monocrystalline thin-film is epitaxially grown on the mirror-polished main face of the silicon wafer according to claim 2.

11. A silicon epitaxial wafer in which a silicon monocrystalline thin-film is epitaxially grown on the mirror-polished main face of the silicon wafer according to claim 3.

12. A silicon epitaxial wafer in which a silicon monocrystalline thin-film is epitaxially grown on the mirror-polished main face of the silicon wafer according to claim 4.

13. A silicon epitaxial wafer in which a silicon monocrystalline thin-film is epitaxially grown on the mirror-polished main face of the silicon wafer according to claim 5.

14. A silicon epitaxial wafer in which a silicon monocrystalline thin-film is epitaxially grown on the mirror-polished main face of the silicon wafer according to claim 6.

15. A silicon epitaxial wafer in which a silicon monocrystalline thin-film is epitaxially grown on the mirror-polished main face of the silicon wafer according to claim 7.

16. A silicon epitaxial wafer in which a silicon monocrystalline thin-film is epitaxially grown on the mirror-polished main face of the silicon wafer according to claim 8.

17. A method of manufacturing a silicon wafer, comprising the steps of:

forming a CVD film on one main face of the silicon wafer by chemical vapor deposition in one process step or in a consecutive manner such that the composition of at least a partial portion of the CVD film continuously changes in the thicknesswise direction of the CVD film, wherein the silicon wafer has a mirror-polished face on the other main face.

18. A method of manufacturing a silicon wafer according to claim 17, wherein the main face of the silicon wafer on which the CVD film is formed is etched or mirror-polished before formation of the CVD film.

19. A method of manufacturing a silicon wafer according to claim 17, wherein the CVD film is formed by plasma chemical vapor deposition.

20. A method of manufacturing a silicon wafer according to claim 18, wherein the CVD film is formed by plasma chemical vapor deposition.

* * * * *